(12) United States Patent
Cheng

(10) Patent No.: US 7,154,285 B2
(45) Date of Patent: Dec. 26, 2006

(54) METHOD AND APPARATUS FOR PROVIDING PCB LAYOUT FOR PROBE CARD

(75) Inventor: Hsu Ming Cheng, Hsin-Chu (TW)

(73) Assignee: Taiwan Semiconductor Manufacturing Co., Ltd. (TW)

( * ) Notice: Subject to any disclaimer, the term of this patent is extended or adjusted under 35 U.S.C. 154(b) by 0 days.

(21) Appl. No.: 10/955,518

(22) Filed: Sep. 30, 2004

(65) Prior Publication Data

US 2006/0066329 A1 Mar. 30, 2006

(51) Int. Cl.
*G01R 31/02* (2006.01)
(52) U.S. Cl. .................. 324/754; 324/761; 324/762
(58) Field of Classification Search ............... 324/754, 324/761, 762; 439/482; 361/777–780
See application file for complete search history.

(56) References Cited

U.S. PATENT DOCUMENTS

| | | | |
|---|---|---|---|
| 6,479,758 B1 * | 11/2002 | Arima et al. ............... 174/260 |
| 6,492,832 B1 * | 12/2002 | Choi et al. .................. 324/765 |
| 6,639,420 B1 | 10/2003 | Chen et al. |
| 6,714,828 B1 | 3/2004 | Eldridge et al. |
| 6,727,719 B1 | 4/2004 | Liao et al. |
| 6,729,019 B1 | 5/2004 | Grube et al. |
| 6,967,557 B1 * | 11/2005 | Hagios et al. ............... 336/200 |

OTHER PUBLICATIONS

"COBRA Vertical Technology Probe Cards", at http://www.wentworthlabs.com/product/cobra.htm on Apr. 23, 2004, pp. 1-3.

* cited by examiner

*Primary Examiner*—Jermele Hollington
*Assistant Examiner*—Arleen M. Vazquez
(74) *Attorney, Agent, or Firm*—Duane Morris LLP

(57) ABSTRACT

An effective and easy to fabricate method to test multiple integrated circuit device designs using a single, probe card design is provided. A universal, probe card design is disclosed herein to test a plurality of integrated circuit devices at the wafer level. Integrated circuit probe pads and probe card probe I/O pins are designed in grid-like pattern on a region of the substrate. Ground terminal encircles the region of the I/O pins and power terminals are provided on the substrate. The I/O terminals can have a constant pitch array or a varying pitch array. The probe card can be used for a family of integrated circuit devices. A method to test flip chip, integrated circuits using a universal probe card has also been disclosed to reduce probe card proliferation and fabrication cost.

15 Claims, 14 Drawing Sheets

( PCB Design for Device B )

( PCB Side of MLC )

Wafer Side of MLC

PCB Side of MLC

METHOD AND APPARATUS FOR PROVIDING PCB LAYOUT FOR PROBE CARD

FIELD OF DISCLOSURE

The invention generally relates to a method for testing integrated circuit devices, and more particularly, to a method for testing multiple design integrated circuits using a single probe card.

BACKGROUND

Testing is a key enabling technology in the art of integrated circuit manufacturing. Typically, testing is performed at the wafer-level and at the package level. When a device is tested at the wafer level, coupling between the device under test ("DUT") and the automated test system is made possible using a probe card. Referring to FIG. 1, a simplified, automated test system is shown. Automated test equipment ("ATE") 10 conventionally includes a high speed and high precision testing circuit. The ATE 10 is coupled to a wafer prober station 14. The wafer prober 14 contains a test head or probe head 18. Wafers are loaded into the test head where they are placed on a wafer stage for testing.

The automated test system is typically a very expensive tool. It is therefore designed as a general-purpose tool to test a number of different integrated circuit designs. Flexibility of use is derived by storing a number of testing programs in ATE 10 that may be selected by the user interface 22 prior to each test. In addition, it is well-known that integrated circuit devices employ a variety of input/output ("I/O"), power and ground pins or terminals. Therefore, the test system must be able to account for these differences. Conventionally, this flexibility is derived by using probe cards.

A probe card is an interface card between the probe head 18 and the DUT. The probe card translates the fixed pin-out capabilities, such as hard wired input channels or output channels of the ATE into a flexible arrangement of pins custom interfaced to a specific IC design. Thus, ATE system 10 can be used to test a number of different designs using a common, and often quite expensive, probe head 18.

Referring to FIG. 2, an exemplary probe card 30 and integrated circuit 38 combination is shown in top view. The integrated circuit die 38 comprises internal circuitry connected to pads 42 that ring the periphery of the device. Pads 42 may comprise bonding pads. A bonding pad is typically a metal pad to which a metal wire is bonded or welded in order to create an interconnection between the device and circuitry of an encapsulating package. Probe card 30 comprises a corresponding set of probe pins 34 that are aligned to physically touch each of the probe pads 42 of the DUT. Probe card 30 couples these probe pins 34 to interconnecting metal lines in the probe card structure that can connect to the probe head of the ATE system when the card 30 is installed in the probe head.

Referring to FIG. 3, a cross sectional view of the probe card 30 in combination with integrated circuit device 38 is shown. Conventionally, many circuit die 38 are formed on a single wafer. In this example, a single die 38 is contacted by probe card 30 for testing. In practice, multiple dies can be probed at one time. The wafer is placed onto a wafer stage 50 and may be further held in place using vacuum or mechanical means. Probe card 30 is fixably attached to the probe head to provide electrical coupling to the ATE and to allow alignment and vertical movement. In a typical arrangement, the probe card 30 is aligned to the wafer under test at a first die location on the wafer. After successful alignment, the probe card 30 may then be indexed across the wafer to test each die 38. Probe card 30 is engaged for testing by vertically moving the card down until the probe pins 34 contact the probe pads 42.

Referring to FIG. 4, an additional exemplary integrated circuit device 60 is shown. Pads 64 are again included around the periphery of the device 60. In this case, however, the integrated circuit device 60 is a flip chip device. In a flip chip device, raised bumps 68 are formed on the surface of the chip. Instead of wire bonding the die to a package, circuit die 60 is flipped over and attached directly to a system-level circuit, such as a circuit board or a ceramic (or Organic) substrate. To facilitate direct connection, the raised bumps commonly comprise a top layer of solder that can be easily melted to create a permanent connection to the circuit board. In the exemplary case, the solder bumps are connected to the wire bonding pads using a redistribution layer 72, such as metal lines.

Referring now to FIG. 5, another probe card is shown in cross sectional view. The probe card is a vertical probe card comprising a probe head 80, probes 84 and bottom guide plate 88. Vertical probe cards are commonly used for flip chip devices. Typically, vertical probe cards require 3 to 4 months to fabricate. The vertical probe technology uses vertical probes that match the pattern of the pads on the IC being tested. This technology allows for the probing of pads in the center of an IC (area array) and is used generally for high-density applications. More importantly, each integrated circuit design requires a customized card to fit the dimensions and pin out of the device. Due to the long fabrication time and the fragility of the probe cards, the integrated circuit manufacturer must purchase several vertical probe cards for each device in case the probe card breaks. Moreover, the probe cards are not universally applicable and a new probe card must be designed for testing new dies.

SUMMARY OF THE DISCLOSURE

In one exemplary embodiment, the disclosure is directed to a layout for a printed circuit board for use with a probe card. The printed circuit board may be configured to have a substrate with a plurality of I/O terminals formed thereon, a ground channel formed on the substrate to provide ground voltage communication to the printed circuit board and a plurality of power ports to communicate power to the circuit board. In one exemplary embodiment, the plurality of I/O terminals define a grid region which is encompassed by the ground channel. Power can be provided to the board by devising one or more power ports (optionally, in the form of rectangular pads) on a region of the circuit board. The power pads may be distributed outside the region of the I/O terminals and next to the ground terminal(s).

In an exemplary method according to one embodiment of the invention, a method for constructing a probe card assembly for use with a vertical probe device such as a Cobra® vertical contact card includes providing a first region with a plurality of I/O terminals formed thereon. The I/O terminals may have a predetermined wiring pattern or an open wiring pattern that can be readily configured for a particular application. For example, the predetermined wiring pattern may have a non-rectangular shape. Further, the predetermined wiring pattern may have an irregular, asymmetric shape. A ground terminal region can be formed on the first region to encompass the first region and provide a structure for grounding the probe card. To provide power to the probe card, a plurality of power terminals can be formed on a region of the probe card assembly, for example, on the periphery of ground terminal region.

In another exemplary embodiment, a universal probe card design is provided to test a plurality of integrated circuit devices at the wafer level. I/O terminals can be designed to have a constant pitch separating each terminal and from the neighboring terminals and to enable the probe card to be used with a family of integrated circuit devices. The embodiments disclosed herein enable substantial proliferation of the probe card and extensive cost reduction.

BRIEF DESCRIPTION OF THE DRAWINGS

The disclosure will be described in relation with the following exemplary and non-exclusive drawings, where.

DETAILED DESCRIPTION

The novel method and apparatus disclosed herein are useful for, among others, forming and testing designs for many types of circuits such as memory circuits, logic circuits, embedded controllers, mixed signal circuits and combinations thereof.

Figure 1:
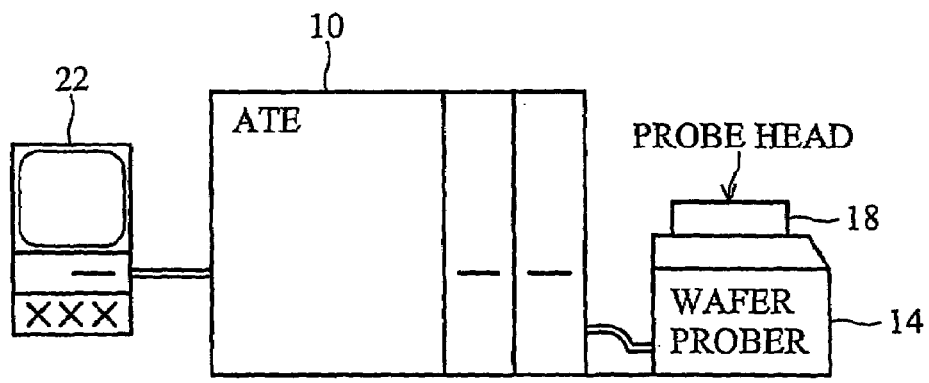
FIG. 1 schematically illustrates an automated test system for testing integrated circuit devices.
Figure 2:
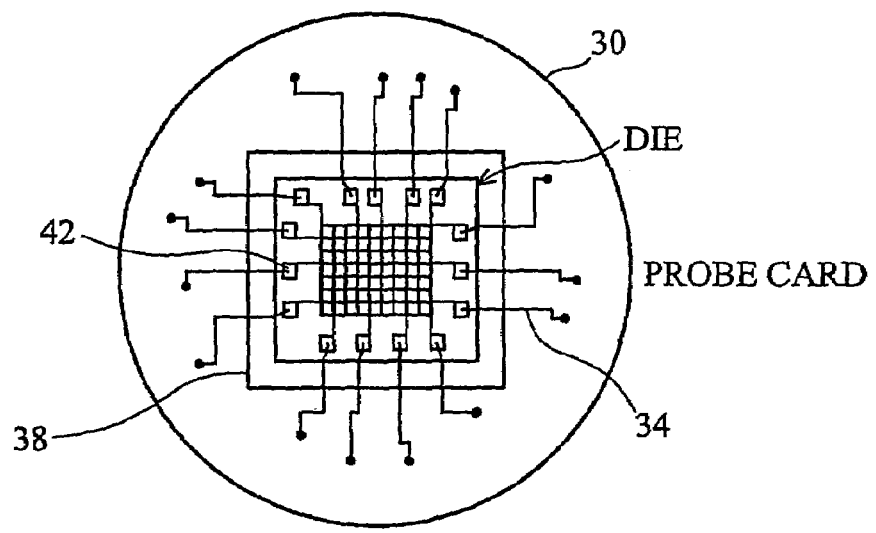
FIGS. 2 and 3 show a probe card and an integrated circuit device in top view and in cross sectional view.
Figure 3:
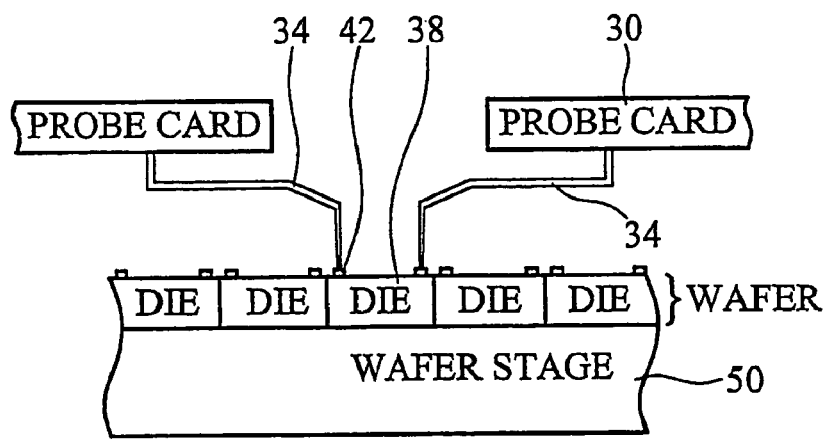
Figure 4:
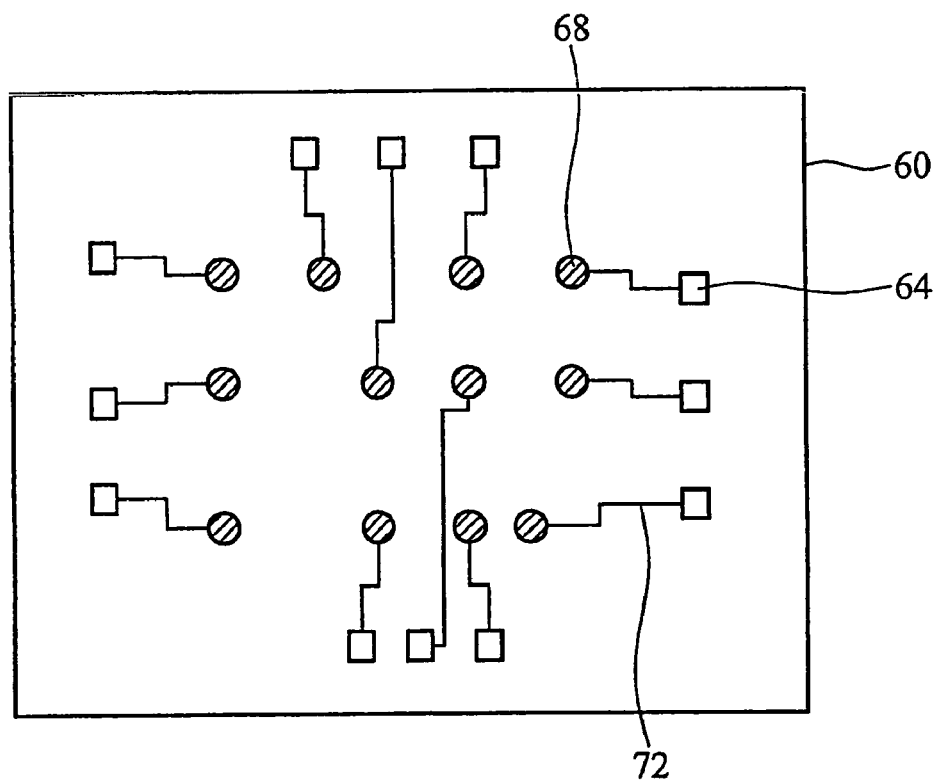
FIG. 4 shows an integrated circuit flip chip device.
Figure 5:
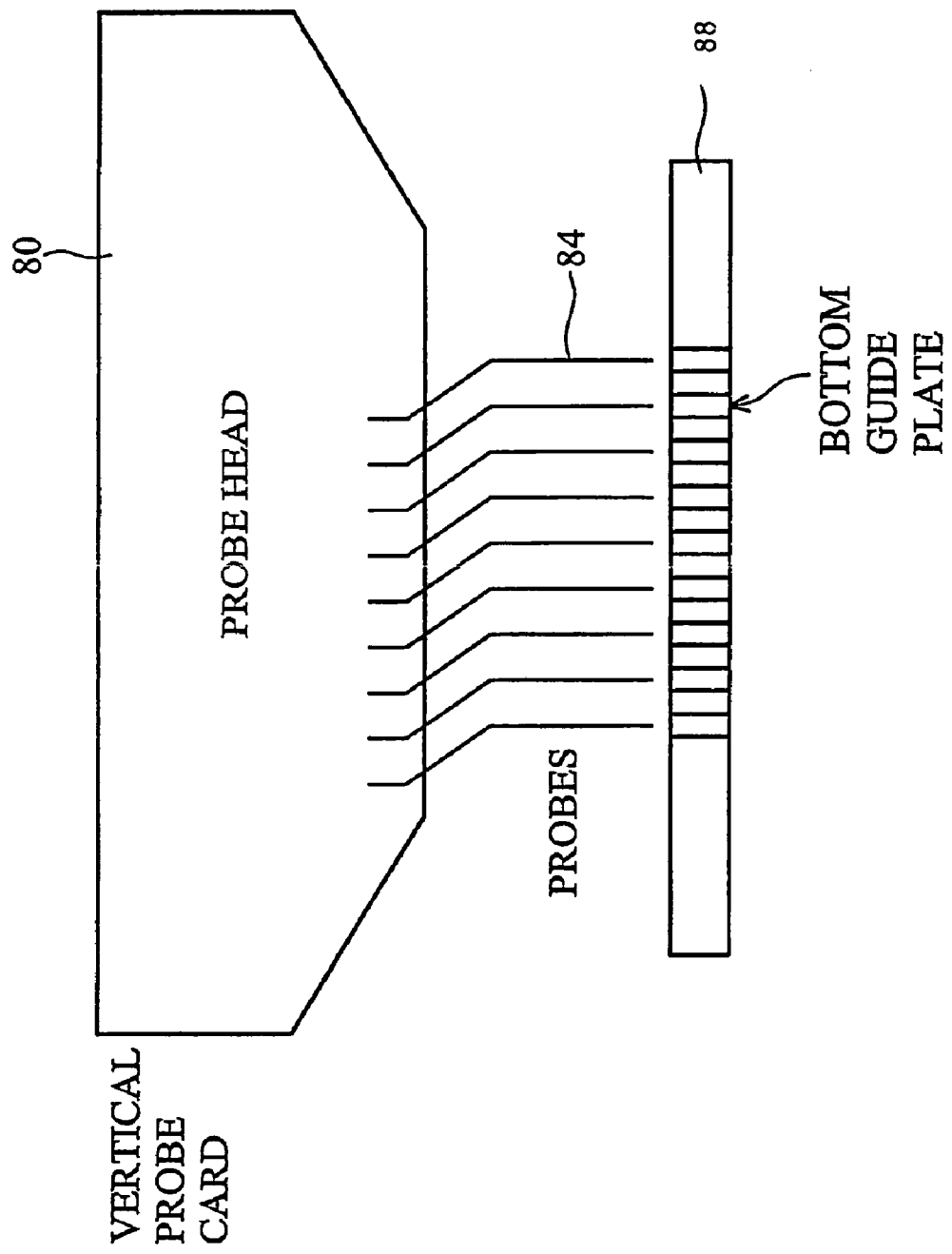
FIG. 5 illustrates a vertical probe card in the cross-sectional view.
Figure 6A:
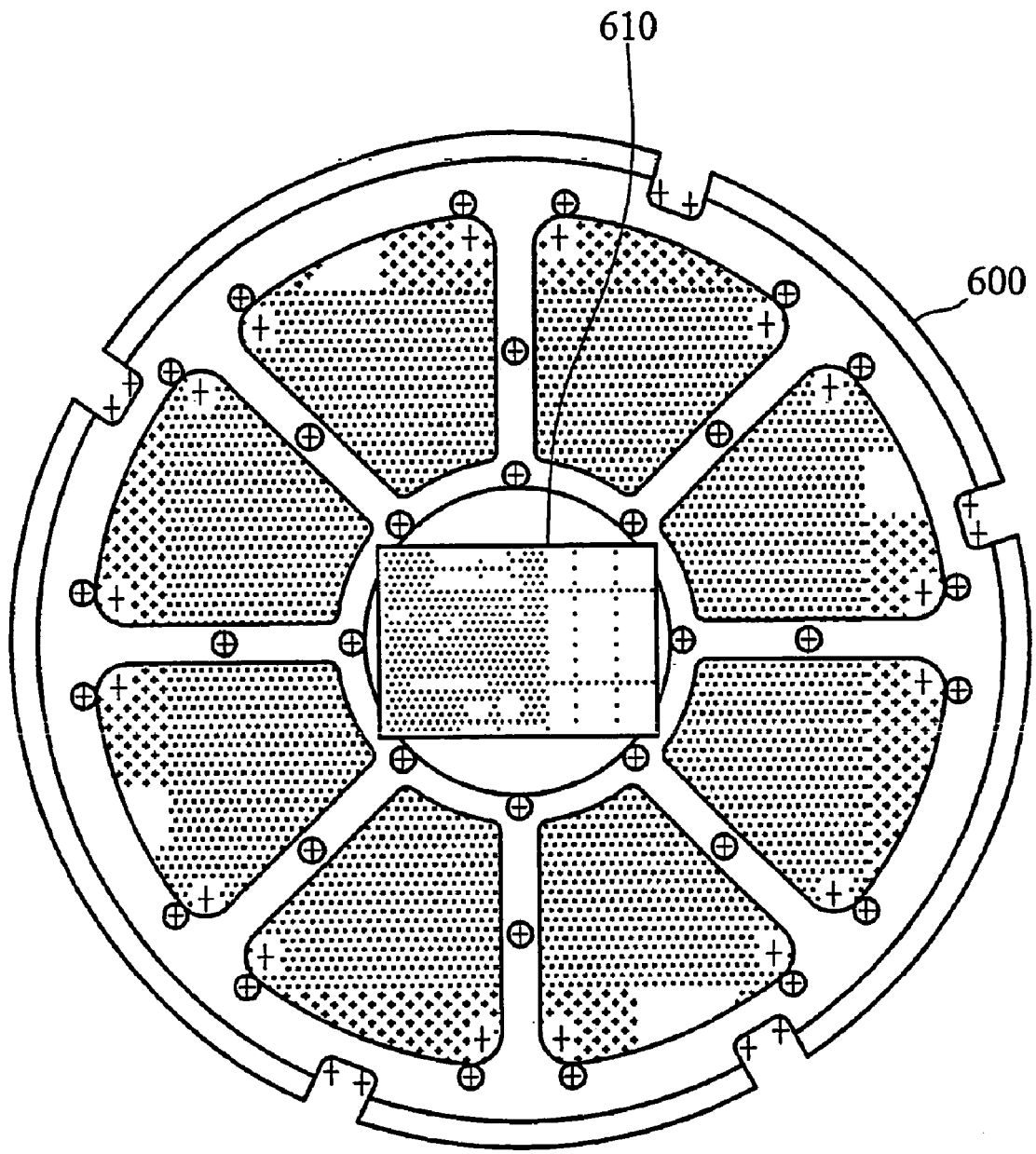
FIGS. 6A–6D show an exemplary PCB design for use with a Cobra® vertical probe card.
Figure 6B:
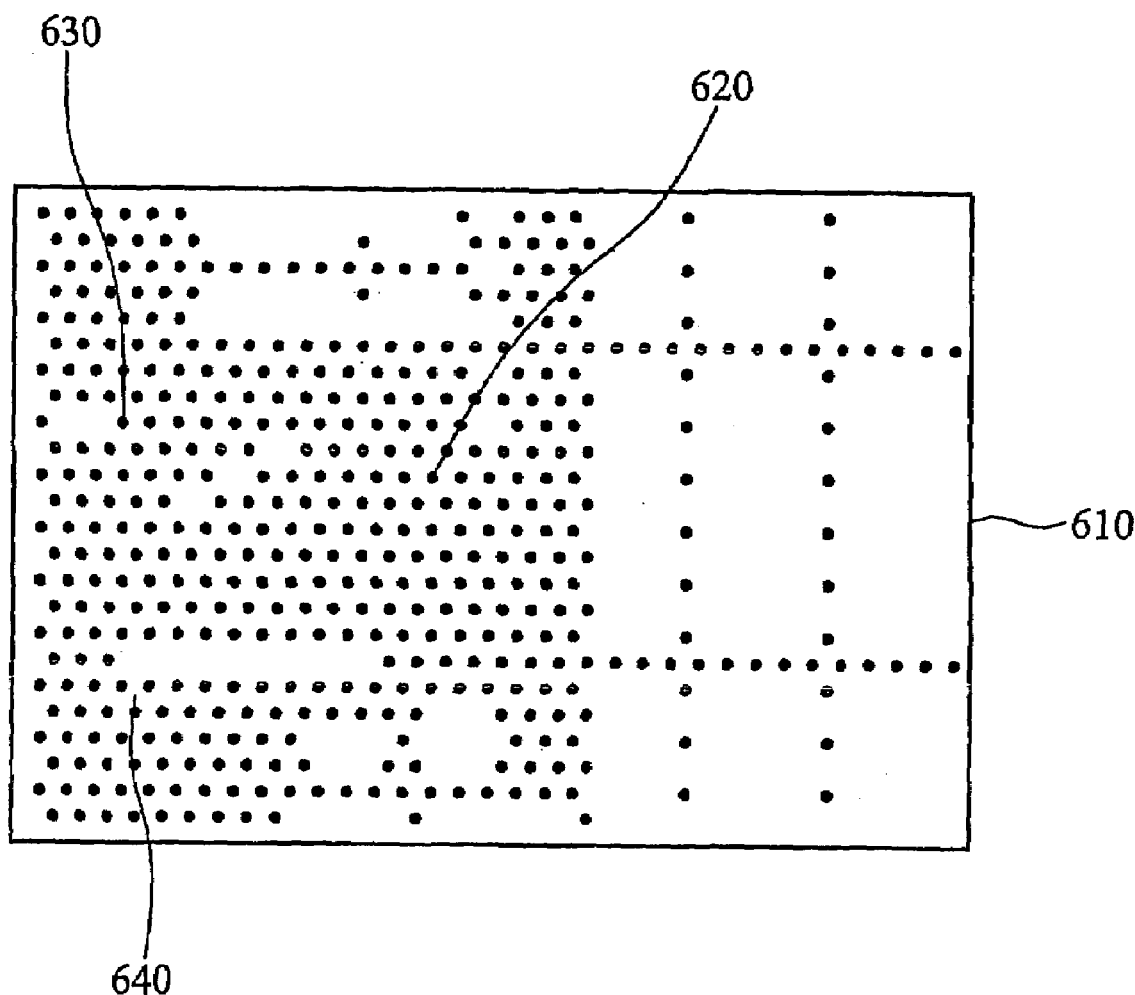
Figure 6C:
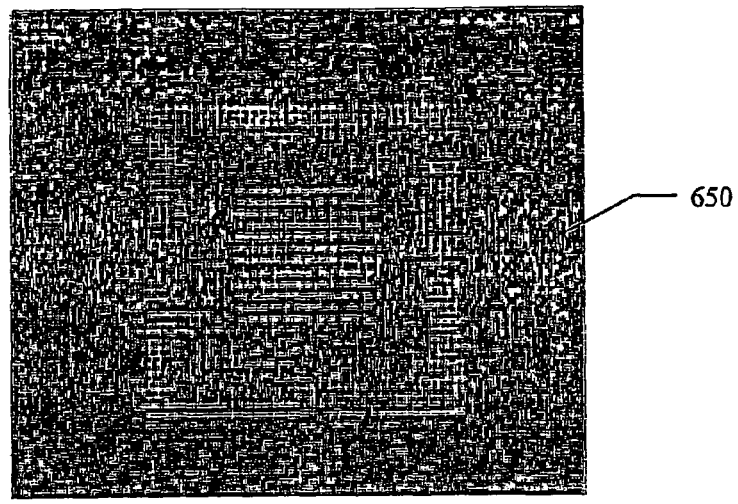
Figure 6D:
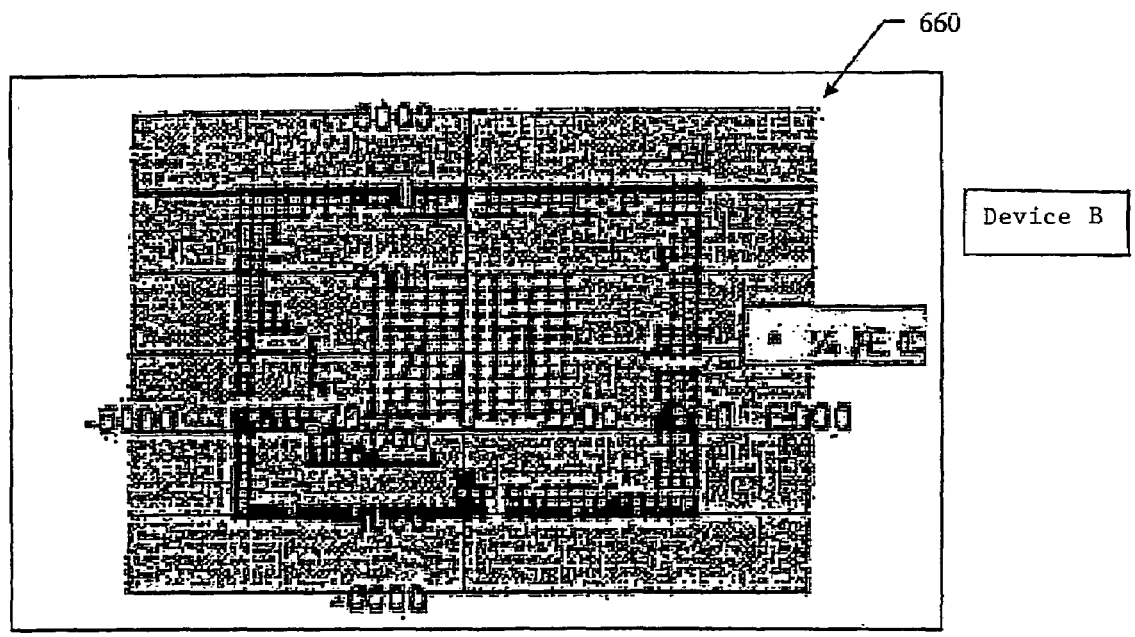

As discussed, the conventional PCB design for multi-layer ceramic ("MLC") or multi-layer organic ("MLO") probe cards fails to provide a universally-adaptable device. Consequently, the PCB must be redesigned for different devices. FIGS. 6A–6C show a conventional PCB design for use with a Cobra® vertical probe card. Referring to FIG. 6A, PCB card 600 is shown to have MLC area 610 at the center thereof. FIGS. 6B and 6C show the PCB side of MLC and wafer side of MLC, respectively. FIG. 6B shows MLC area 610 as having ground terminal 620, power terminal (interchangeably, power port) 630 and I/O terminals 640. A conventional design of the device shown in FIG. 6 requires designing the wafer side of MLC 650 (in FIG. 6C) followed by designing the PCB layout (610 in FIG. 6B) and then designing the PCB card 600. An exemplary device 660 is shown in FIG. 6D. Probe card 600 can be used with device 660. Thus, the conventional procedure requires the additional steps of custom-designing the PCB.

Figure 7A:
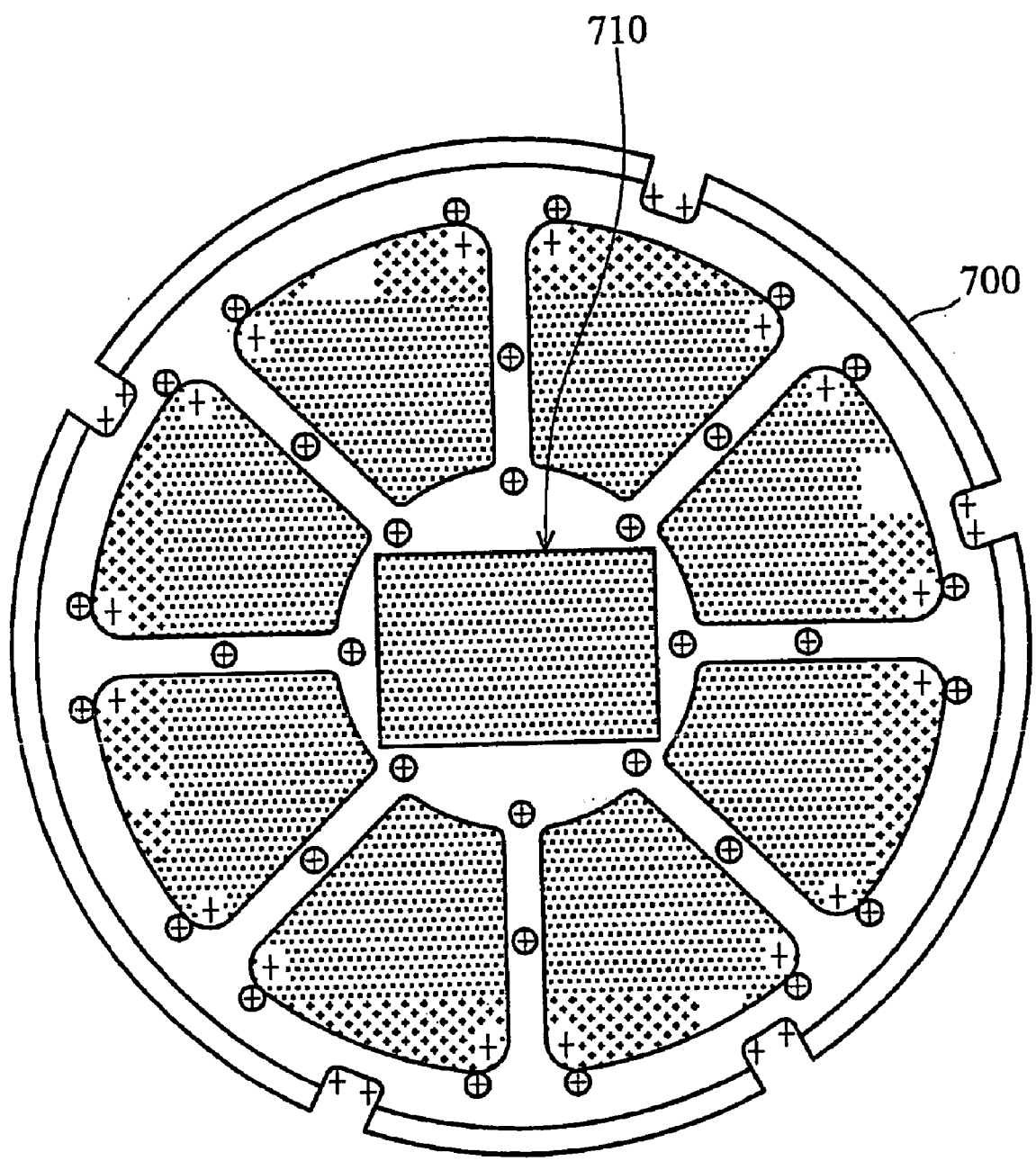
FIGS. 7A–7D show another exemplary PCB design for use with a Cobra® vertical probe card.
Figure 7B:
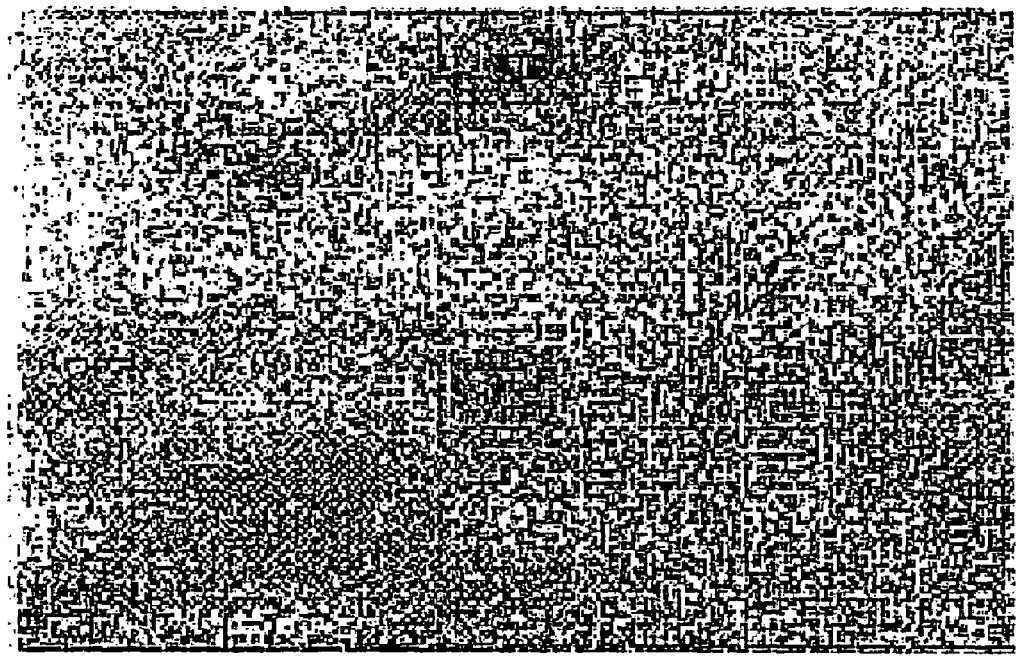
Figure 7C:
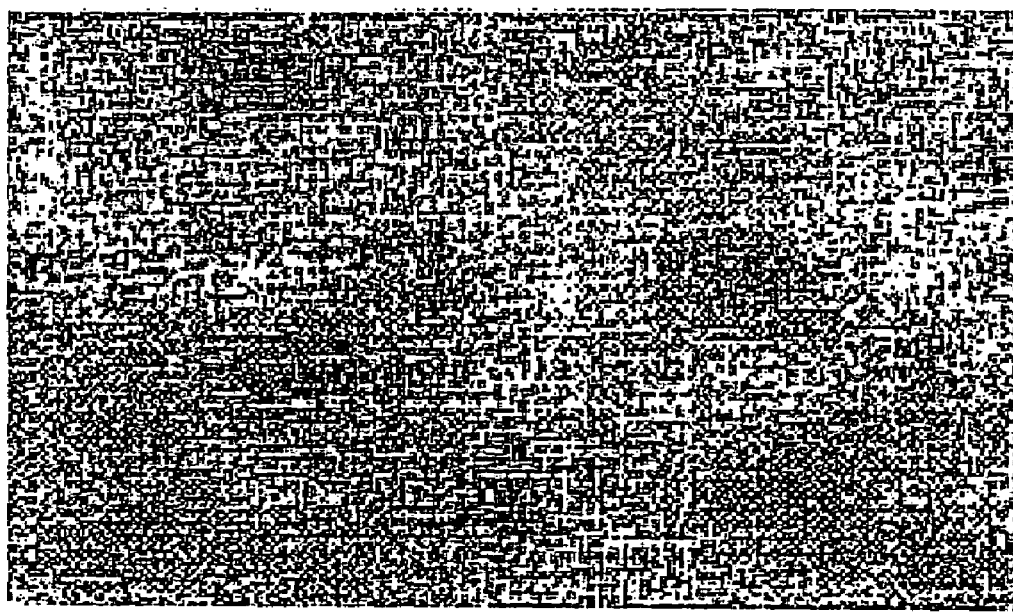
Figure 7D:
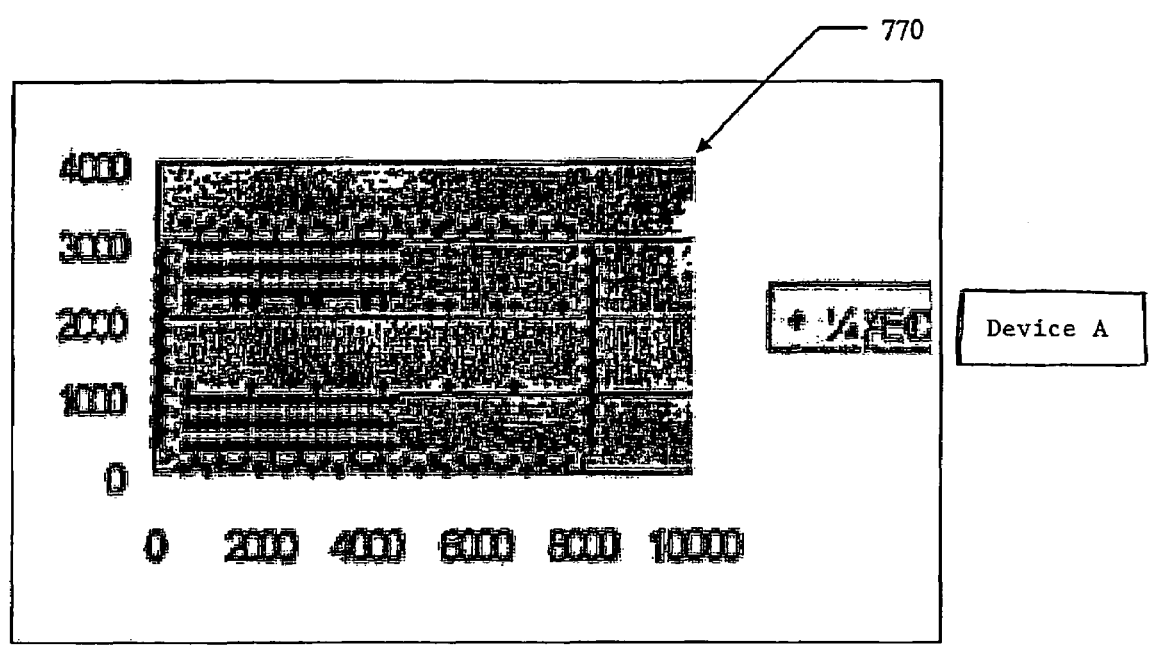

FIG. 7A–7C show an exemplary PCB design for use with a Cobra® vertical probe card. In FIG. 7, PCB card 700 is specifically configured to be used with device 770 shown in FIG. 7D. PCB card 700 is shown to have MLC area 710 at the center thereof. FIGS. 7B and 7C show the PCB side of MLC and wafer side of MLC, respectively. Although not specifically shown in FIG. 7, MLC area 710 includes ground terminals, power terminals and I/O terminals.

As seen in FIGS. 6 and 7, a dense array of terminals is provided at the MLC area to conform to the DUT. The layout shown in FIGS. 6 and 7 is device-specific and cannot be readily applied to a number of a different DUT. As a result, the PCB must be redesigned or rewired for each specific application. This process is both costly and time consuming.

Figure 8A:
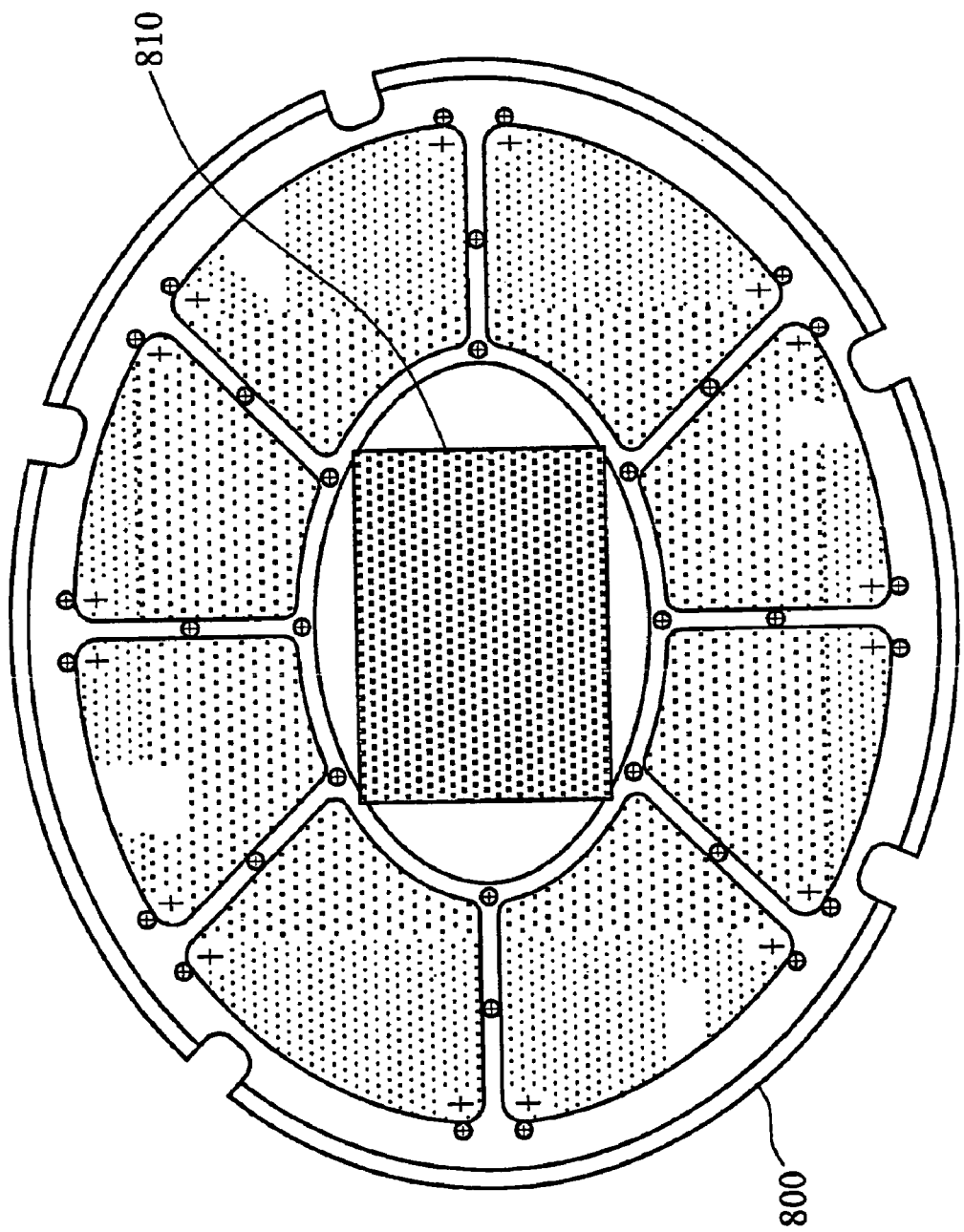
FIGS. 8A and 8B show a PCB design for a probe card according to an exemplary embodiment of the disclosure.
Figure 8B:
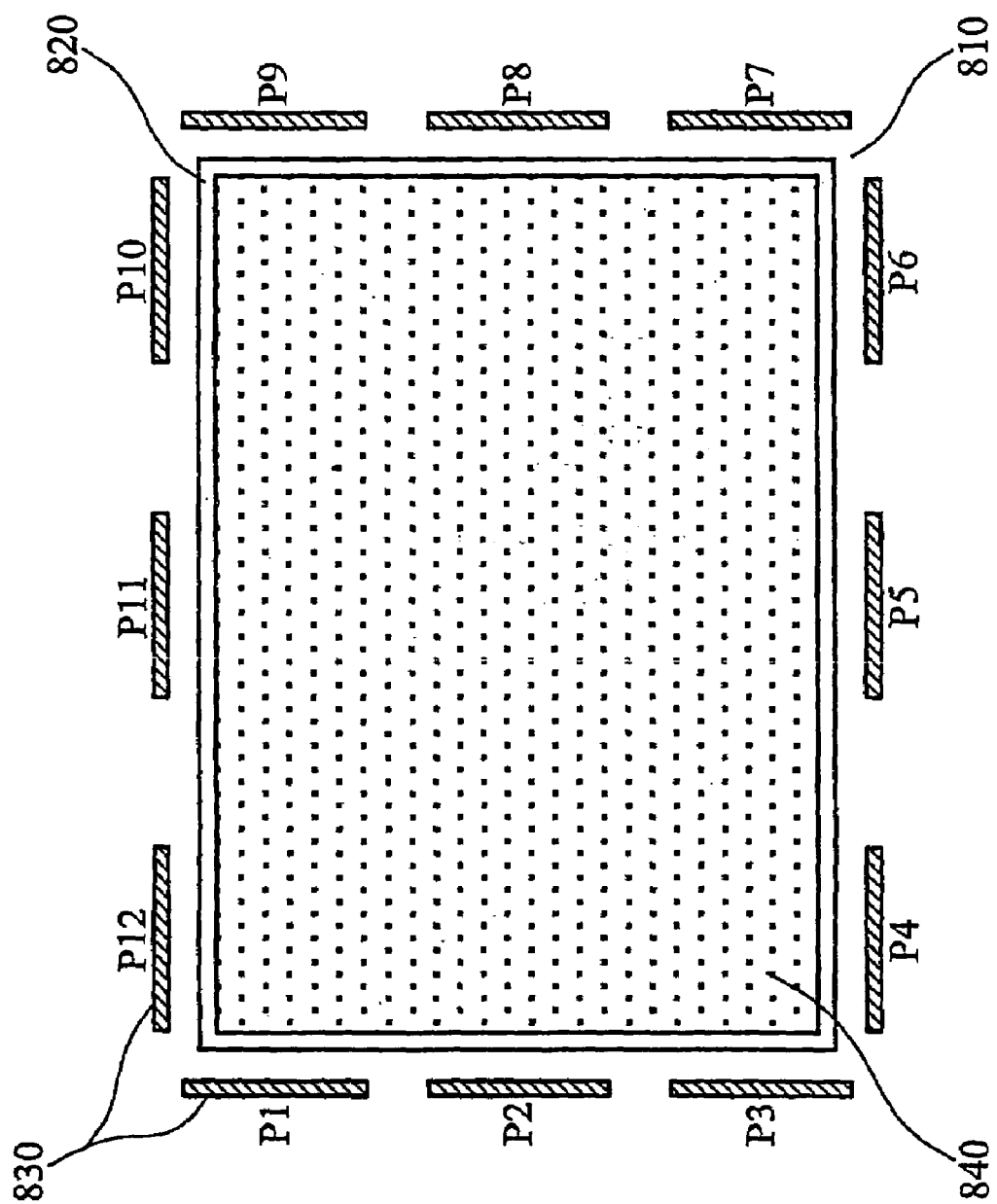

FIGS. 8A and 8B show a PCB design according to an exemplary embodiment of the invention. FIGS. 8A and 8B may be used, among others, with a Cobra® vertical probe card. Referring to FIG. 8A, PCB card 800 is shown to have MLC area 810 at the center thereof. FIG. 8B shows MLC area 810 configured to have the I/O terminals 840 allocated to a region at the center of the MLC. By placing I/O terminals 840 at a central location, the terminals can be easily rewired to test a particular DUT. In addition, the grid pattern of the I/O terminals reduces manufacturing time and labor cost. The high density of I/O terminals enable high pin count numbers on large probing surfaces with very small pad pitch distances. The probe card allows grid array probing on bumps as well as parallel probing capabilities. Probes can be placed in any position on the wafer. The configuration also enables the probe card to be used with ultra-high-density, multi-DUT, grid array probing, high-temperature and high frequency applications on aluminum pads and bumps. The number of I/O pins depends on the tester type. For example, for HP93K tester, the total I/O signal pins are 1024. Further, the pitch distance can be varied according to the application. In an exemplary embodiment, the pitch distance between the pins is 1.0 mm.

Although the arrays shown in FIGS. 8A and 8B are shown to have a fixed pitch, a variable pitch array can also be configured without departing from the principles of the invention. The I/O terminal array can include standardized specific locations in the array for specific types of uses. For example, a part of array 840 can be dedicated for a particular application. Therefore, the integrated circuit can be designed to place I/O pins in region 840 and the universal probe card can be designed to place automated tester I/O channels in the same region. Another advantage of the principles disclosed herein is that a universal PCB design can accommodate various DUTs and only the wafer side of the MLC need to be configured for each device.

Referring again to FIG. 8B, ground terminal 820 is shown to surround and encompass the I/O terminal grid 840. The configuration shown in FIG. 8B provides uniformity in layout of PCB 800 reusable for testing a variety of DUT. As compared with the conventional design shown in FIGS. 6 and 7 where Ground terminal can be located anywhere on the PCB, the configuration shown in FIG. 7B renders cross-compatibility relatively easy. Although ground terminal 820 is shown as a square ring surrounding the I/O signal terminals 840, the principles of the invention are not limited thereto and can include variations and permutations thereof. For example, the ground terminal can be devised as discrete ports disposed anywhere outside of the I/O grid 840.

Power channels 830 are shown as ports or rectangular pads P1 to P12. Power pads 830 are positioned around I/O grid 840 and ground terminals 820. Comparing the layout of FIG. 8B with the conventional configuration of FIGS. 6 and 7, it can be seen that power pads 830 (namely, P1–P12) are readily ascertainable as compared with power terminal 730 of FIG. 6B. Some devices, especially those containing several types of circuits require a plurality of power supplies. In the exemplary embodiment of FIG. 8, a plurality of power pads 830 are disposed around the ground terminal 820 for this purpose. Power pads 830 can also be positioned alongside the ground terminal 820 without departing from the spirit of the invention. Furthermore, power pads 830 need not form a power ring as shown in FIG. 8B and can be disposed only on one side of the PCB card. Thus, the novel method and apparatus of the present invention can be configured to have as many power pads as needed at different locations of the PCB. The probe card disclosed herein can be reused as it is universally configured and can be rewired easily without changing its general configuration.

According to an exemplary embodiment of the disclosure, a method to fabricate a probe card may include the steps of providing a first region having a plurality of I/O terminals. The I/O terminals can have one of a number of predetermined or predefined wiring patterns. Such patterns can be defined by the customer to match the probe card to the desired application. Thus, a predefined or predetermined wiring pattern may be configured to make the probe card consistent with the DUT. The I/O terminals may also have contact points on the surface of each I/O terminal. Next, a ground terminal in the form of a continuous region can be formed on the periphery of the region occupied by the I/O terminals. The design for the wafer side of MLC is according to the solder ball coordinates of bump device. All the traces of the device can be formed as a layout to the PCB side of MLC. The ground terminal region can encompass the I/O terminals and provide means for grounding the probe card. A plurality of power channels may be devised to conduct power to the probe card assembly. The power channels can be formed as rectangular pads and dispersed about the ground terminal region.

Figure 9A:
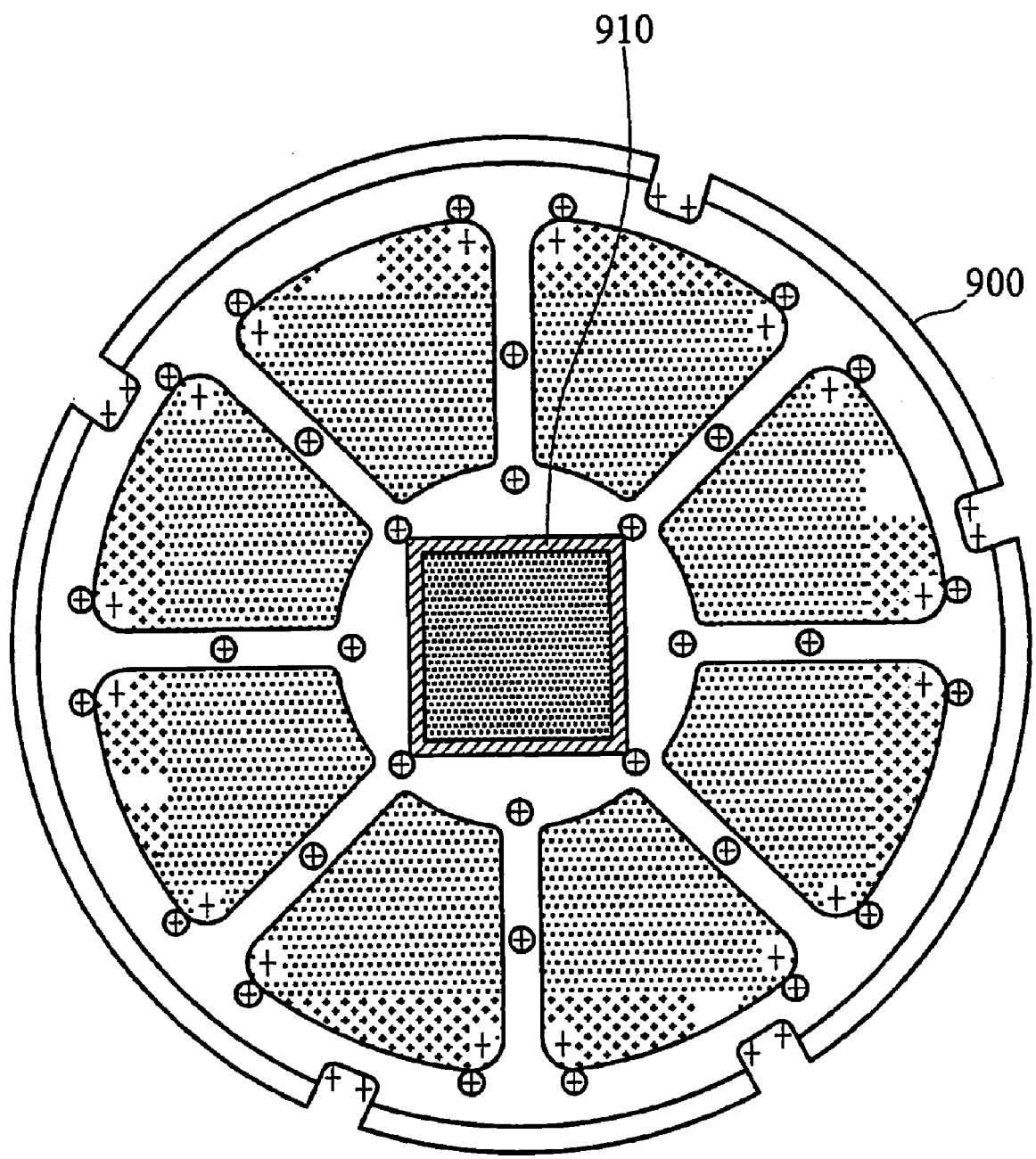
FIGS. 9A–9D illustrates a universal design according to one embodiment of the disclosure.
Figure 9B:
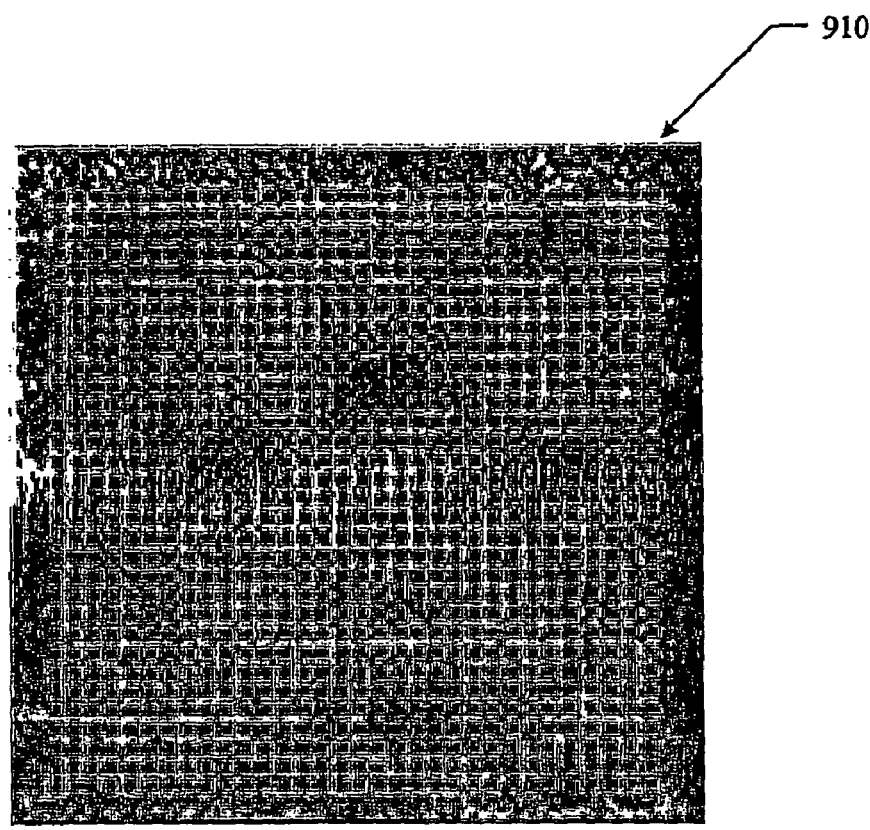
Figure 9C:
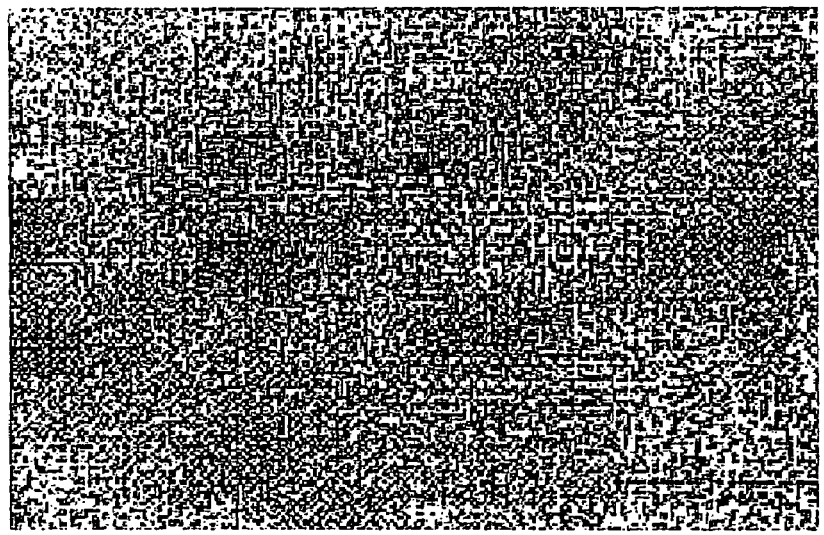
Figure 9D:
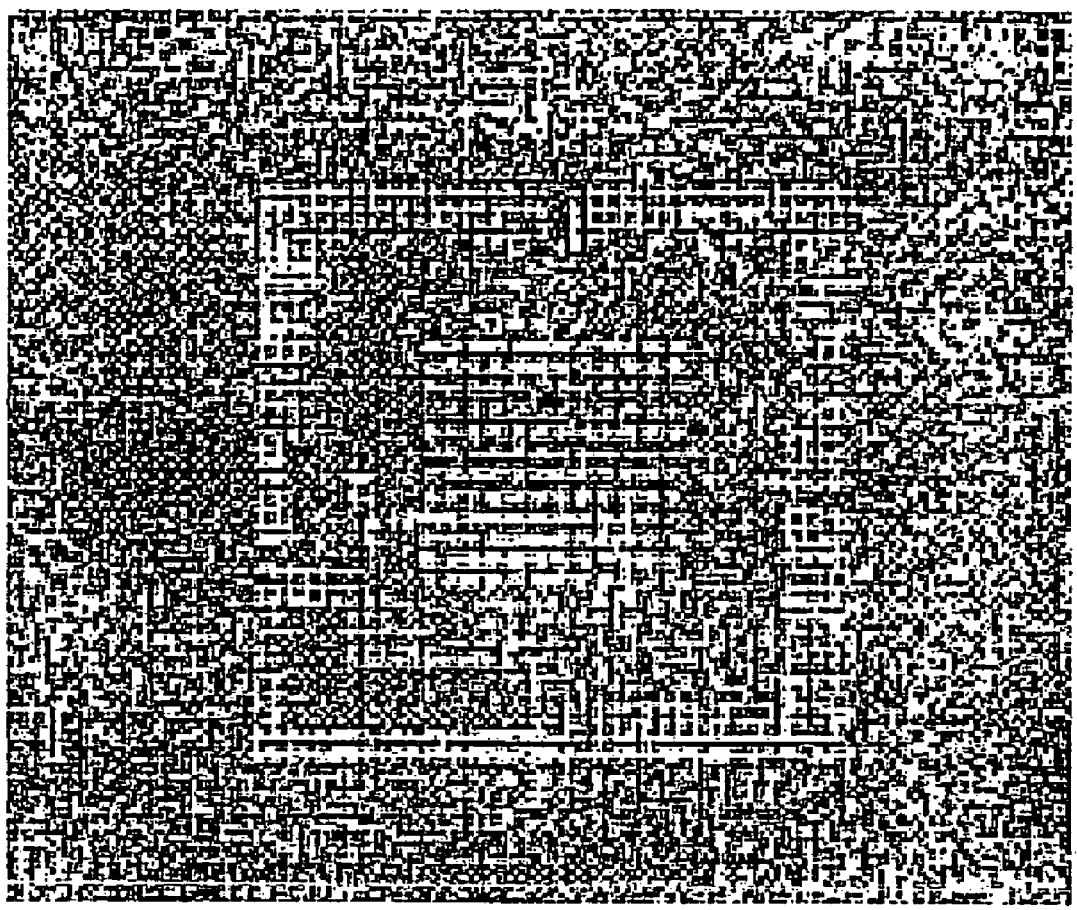

In accordance with another embodiment, a method to fabricate a probe card may include providing a uniform layout followed by designing the MLC side of the PCB. FIGS. 9A–9D illustrates a universal design according to one embodiment of the disclosure. In FIG. 9A a universal PCB design is shown for a cobra probe card 900 having PCB layout 910. In FIG. 9B, the design for PCB side of the MLC can be made universal as shown. This layout enables any MLC configuration as long as the number of I/O pins are equal or less than 1024 pins. FIGS. 9C and 9D show the wafer side of the MLC design for use with device 6D and 7D, respectively. As can be seen, although the wafer sides of FIGS. 9C and 9D are different, they both can share the same PCB side.

Because the probe card is used for high speed testing, using the appropriate material for construction of the PCB is critical. In one embodiment, a material having a low dielectric constant is used. Conventional dierlectic material for use in PCB includes glass reinforced epoxy laminate (e.g., G10/F4 with dielectric constant 4.8); Polyimid material (dielectric constant 4.2); Polycrystalline $BaTiO_3$ (BT) (dielectric constant of about 3.3–3.9) and epoxy glass material such as RO4003™ supplied by Rogers Corporation of Rogers CT (dielectric constant of about 3.38) can be used.

The difference in the I/O paths should be considered. In order to allow the pattern to reach each pin at the same time, the difference of each I/O path length must be small. Even though a tester may have a fixed delay function, this limitation may be large if the difference in the I/O paths is too large. Thus, in one embodiment of the disclosure, the difference between the various I/O paths is about 5 mils or less.

For better performance, impedance may be controlled to be within a range of about 50 ohm±5%. If impedance is not controlled, it can cause the function fail issue. The resistance should also be considered. The smaller the resistance, the better the performance of the testing device. The resistance of each I/O path should be controlled under 1.0 ohm. The I/O path length and cross section will influence the resistance. The shorter length and bigger cross section can reduce resistance. Additionally, the flatness of PCB mechanism will influence the planarity of cobra probe card. Therefore, it is important to control the flatness. In one embodiment, the flatness is maintained under 0.7 mill per inch.

The embodiment disclosed herein are suited all I/O signal layouts. For example, the for devices having fewer I/O pins, a grid having less pins can be used (e.g., 840 pins). Thus, several layout can be configured according to the principles disclosed herein to include 1024 pins, 768 pins, 512 pins, 384 pins or 192 pins. Furthermore, the embodiments disclosed herein are suitable for different applications, including all tester's type printed circuit boards. The new PCB design disclosed herein can be used, among others, for building the MLC cobra probe card for all bump devices. It can substantially reduce design cost and reduce the cycle time of the cobra probe building process. The principles disclosed herein can also save the cost of PCB side mask for the MLC substrate since the pattern of the mask will remain constant. The following table provides a comparison of the benefits gained from the principles disclosed herein:

| Item | Old Design | New Design |
| --- | --- | --- |
| PCB Design (NRE charge) | $1500,000 | None (for each device) |
| Cycle Time (design and build) | About 6 weeks | None (universal design, PCB can be in stock) |

It will be understood by one of ordinary skill in the art that the apparatus and method disclosed herein can be reused or reconfigured to suit a particular application without departing from the principles disclosed herein.

What is claimed is:

1. In a multi-layer vertical probe card for use in a vertical probe card having a printed circuit board and a plurality of signal channels including at least one ground terminal, a plurality of I/O terminals and a plurality of power terminals, the improvement comprising a first region including the plurality of I/O terminals, a second contiguous region containing a ground terminal circumferentially surrounding the first region and a third region circumferentially surrounding the second region, the third region containing the plurality of power terminals.

2. The vertical probe card of claim 1, wherein at least one of the plurality of power terminals is a rectangular pad.

3. The vertical probe card of claim 1, wherein the I/O terminals are arranged to form a grid.

4. The vertical probe card of claim 1, wherein the ground terminal is substantially rectangular.

5. The vertical probe card of claim 1, wherein the I/O terminals are interconnected according to a predefined configuration.

6. The vertical probe card of claim 1, wherein the second contiguous region containing a ground terminal circumferentially surrounds a discontiguous region of the first region.

7. A printed circuit board for use with a probe card, the printed circuit board comprising:
   a substrate having a plurality of I/O terminals formed thereon;
   a contiguous ground terminal formed on the substrate to provide ground voltage communication;
   a plurality of power ports to communicate power to the circuit board;
   wherein the plurality of I/O terminals define a grid enclosed by the contiguous ground terminal.

8. The printed circuit board of claim 7, wherein the plurality of I/O terminals further comprise a wiring pattern.

9. The printed circuit board of claim 7, wherein the plurality of I/O terminals are arranged according to a wiring pattern.

10. The printed circuit board of claim 7, wherein each of the plurality of the I/O terminals further comprises a contact point.

11. A vertical probe card having the printed circuit board of claim 7.

12. The printed circuit board of claim 7, wherein the plurality of I/O terminals define a grid entirely enclosed by the contiguous ground terminal.

13. The printed circuit board of claim 7, wherein the plurality of I/O terminals define a grid at least partially enclosed by the contiguous ground terminal.

14. A probe card for use with an automated wafer testing station comprising a substrate having a plurality of a first, a second and a third terminal groups formed thereon; the first terminal group defined by a plurality of interconnect means forming a first pattern; wherein the plurality of the interconnect means defined by the first pattern are circumferentially surrounded by at least one of the second or the third terminals, wherein said second terminal defines a contiguous region and wherein said third terminal defines a plurality of troughs.

15. The probe card of claim 14, wherein each of the planar distance between adjacent interconnect means is different from the distance between adjacent troughs.

* * * * *